(12) United States Patent
Boroson et al.

(10) Patent No.: US 6,555,284 B1
(45) Date of Patent: Apr. 29, 2003

(54) IN SITU VACUUM METHOD FOR MAKING OLED DEVICES

(75) Inventors: Michael L. Boroson, Rochester, NY (US); Steven A. VanSlyke, Pittsford, NY (US); Aneglo G. Pignata, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/033,459

(22) Filed: Dec. 27, 2001

(51) Int. Cl.[7] .............................. G03F 7/34; G03F 7/38; G03F 7/16
(52) U.S. Cl. ........................ 430/201; 430/200; 430/319
(58) Field of Search ................................. 430/200, 201, 430/319

(56) References Cited

U.S. PATENT DOCUMENTS

| | | | |
|---|---|---|---|
| 5,578,416 A | 11/1996 | Tutt | 430/201 |
| 5,688,551 A | 11/1997 | Littman et al. | 430/200 |
| 5,742,129 A | 4/1998 | Nagayama et al. | 315/167 |
| 5,851,709 A | 12/1998 | Grande et al. | 430/200 |
| 5,937,272 A | 8/1999 | Tang | 430/200 |
| 6,114,088 A | 9/2000 | Wolk et al. | 430/200 |
| 6,140,009 A | 10/2000 | Wolk et al. | 430/200 |
| 6,194,119 B1 | 2/2001 | Wolk et al. | 430/200 |
| 6,214,520 B1 | 4/2001 | Wolk et al. | 430/200 |
| 6,221,553 B1 | 4/2001 | Wolk et al. | 430/200 |

FOREIGN PATENT DOCUMENTS

EP    1 028 001 A1    8/2000

*Primary Examiner*—Richard L. Schilling

(57) ABSTRACT

An in-situ vacuum method for fabricating, at least in part, an OLED device that is moisture- or oxygen-sensitive, such method including providing into a vacuum coater a receiver element which will form part of the OLED device; providing into said vacuum coater a donor support element and coating such donor support element to produce a donor element with one or more layers required to produce all or part of the OLED device; positioning the coated side of the donor element in material transferring relinquish to the receiver element to be coated; and applying radiation to the d nor element to selectively transfer in vacuum one or more layers from the donor element to the receiver element.

14 Claims, 8 Drawing Sheets

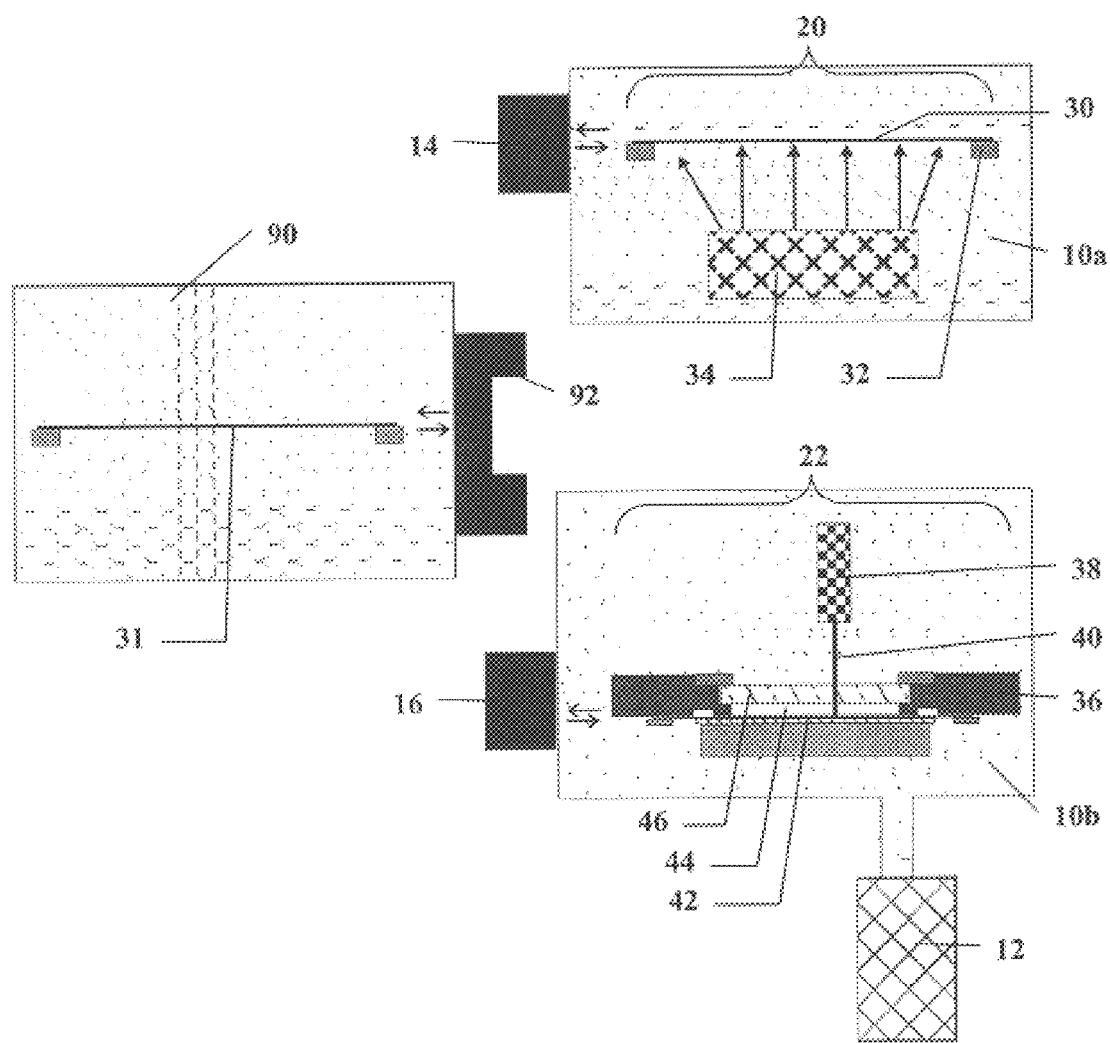

IN SITU VACUUM METHOD FOR MAKING OLED DEVICES

CROSS REFERENCE TO RELATED APPLICATIONS

Reference is made to commonly assigned U.S. patent application Ser. No. 10/021,410 filed Dec. 12,2001 by Phillips, et al., the disclosure of which is incorporated herein by reference.

FIELD OF THE INVENTION

The present invention relates to making OLED devices.

BACKGROUND OF THE INVENTION

In color or full-color organic electroluminescent (EL) displays (also known as organic light-emitting diode devices, or OLED devices) having an array of colored pixels such as red, green, and blue color pixels (commonly referred to as RGB pixels), precision patterning of the color-producing organic EL media are required to produce the RGB pixels. The basic OLED device has in common an anode, a cathode, and an organic EL medium sandwiched between the anode and the cathode. The organic EL medium can consist of one or more layers of organic thin films, where one of the layers is primarily responsible for light generation or electroluminescence. This particular layer is generally referred to as the emissive layer of the organic EL medium. Other organic layers present in the organic EL medium can provide electronic transport functions primarily and are referred to as either the hole transport layer (for hole transport) or electronic transport layer (for electron-transport). In forming the RGB pixels in a full-color OLED display panel, it is necessary to devise a method to precisely pattern the emissive layer of the organic EL medium or the entire organic EL medium.

Typically, electroluminescent pixels formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged per time. Plugged holes on the mask lead to the undesirable result of non-functioning pixels on the EL display.

A suitable method for patterning high resolution OLED displays has been disclosed in U.S. Pat. No. 5,851,709 by Grande, et al. This method is comprised of the following sequences of steps: 1) providing a substrate having opposing first and second surfaces; 2) forming a light-transmissive heat-insulating layer over the first surface of the substrate; 3) forming a light-absorbing layer over the heat-insulating layer; 4) providing the substrate, with an array of openings extending from the second surface to the heat-insulating layer; 5) providing a transferable color forming organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande, et al. approach is that patterning of an array of openings on the donor substrate is required. This creates many of the same problems as the shadow mask method, including the requirement for precision mechanical alignment between the donor substrate and the display substrate. A further problem is that the donor pattern is fixed and cannot be changed readily.

Using an unpatterned donor element an a precision light source, such as a laser, can remove some of the difficulties seen with a patterned donor. Littman and Tang (U.S. Pat. No. 5,688,551) teach the patternwise transfer of organic EL material from an unpatterned donor sheet to an EL substrate. A series of patents by Wolk, et al. (U.S. Pat. Nos. 6,114,088; 6,10,009; 6,214,520 B1; and 6,221,553 B 1) teaches a method that can transfer the it luminescent layer of an EL device from a donor element to a substrate by heating elected portions of the donor with a laser beam.

In commonly assigned U.S. Pat. No. 5,937,272, Tang has taught a method of patterning multicolor pixels (e.g. red, green, blue subpixels) onto a thin-film-transistor (TFT) array substrate by vapor deposition of an EL material. Such EL material is deposited on a substrate in a selected pattern via the use of a donor coating on a support and an aperture mask. Th aperture mask can be a separate entity between the donor layer and substrate (as in FIG. 1 in the aforementioned patent), or can be incorporated into the donor layer (as in FIGS. 4, 5, and 6 in the aforementioned patent).

The EL material transfer is preferably one under reduced pressure, using a chamber such as Tang describes in the afore mentioned patent. The donor layer (and aperture, if separate) and substrate must be kept in close proximity. As an example, Tang shows an aperture or donor layer held close to or on a passivating layer, such that there is a preferable distance between the donor layer and the intended donor target of the bottom electrode. The use of vacuum or reduced pressure facilitates the transfer of the EL material from the donor to the substrate. The use of such conditions during transfer is also advantageous in that some EL materials are sensitive to oxygen and/or moisture. For example, aluminum hydroxyquinoline (Alq), which is used in OLED devices, is known to react with water. In addition, the electrode materials used on both small molecule and polymer EL devices are extremely unstable in air. The use of a vacuum during the transfer step can help reduce the failure rate of OLED devices. Additionally, losses of OLED devices can occur because of degradation of the donor material before transfer to the substrate in the methods taught by Littman, Tang, and Wolk. The donor material is generally transported from its preparation site to the site where it is transferred to the substrate. Contamination of the donor by oxygen, moisture, and/or other atmospheric components is possible during this time. This can lead to reduced yields of OLED displays prepared from the donor.

SUMMARY OF THE INVENTION

It is therefore an object of the present invention to provide a method, which eliminates the need for a shadow mask.

It is a further object of the present in invention to provide a method which uses a donor element but eliminates problems associated with providing a donor element at a remote location from where it is to be used and shipping such donor element without causing contamination or damage to the donor element.

It is a further object of the present invention to provide an improved shadow mask free method which effectively can be used to produce full-color OLED displays.

This object is achieved by an in-situ vacuum method for fabricating, at least in part, an OLED device that is moisture- or oxygen-sensitive, such method comprising the steps of:

a) providing into a vacuum coater a receiver element which will form part of the OLED device;

b) providing into said vacuum coater a donor support element and coating such donor support element to produce a donor element with one or more layers required to produce all or part of the OLED device;

c) positioning the coated side of the donor element in material transferring relationship to the receiver element to be coated within said vacuum coater; and d) applying radiation to the donor element to selectively transfer in vacuum one or more layers from the donor element to the receiver element.

ADVANTAGES

An advantage of the method described in the present invention is that it is useful in producing OLED devices without introducing moisture, oxygen, or other atmospheric components and without using shadow mask.

In accordance with the present invention, donor element is made with the same vacuum coater used for transferring materials from the donor element to the OLED receiver element. This provides number of advantages including reducing the need for donor storage and transport, and concomitant contamination; reducing or eliminating damage and contamination from the contact of the donor side with the support side of the donor; and reducing the keeping requirements for the donor.

A further advantage is that this method can be fully automated including donor and substrate media handling. The present invention is particularly suitable for forming organic,layers over large area having a number of OLED display devices, which are in the process of being formed, thereby increasing throughput.

BRIEF DESCRIPTION OF THE DRAWINGS

FIG. 8 is a cross-sectional representation of another embodiment of the present invention in which the donor support element is coated and the transfer to the substrate is affected in two separated evacuate chambers.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "OLED device" refers to a device including organic light-emitting diodes, sometimes called an electroluminescent device, and an EL device, as described by, e.g., Tang in commonly assigned U.S. Pat. No. 5,937,272 and by Littman and Tang in commonly assigned U.S. Pat. No. 5,688,551. The term "display" or "display panel" is employed to designate a screen capable of electronically displaying video images or text. The term "pixel" is employed in its art recognized usage to designate an area of a display panel that can be stimulated to emit light independently of other areas. The term "multicolor" is employed to describe a display panel that is capable of emitting light of a different hue in different areas. In particular, it is employed to describe a display panel that is capable of displaying images of different colors. These areas are not necessarily contiguous. The term "full-color" is employed to describe multicolor display panels that are capable of emitting in the red, green and blue regions of the visible spectrum and displaying images in any combination of hues. The red, green, and blue colors constitute the three primary colors from which all other colors can be generated by appropriately mixing these three primaries. The term "hue" refers to the intensity profile of light emission within the visible spectrum, with different hues exhibiting visually discernible differences in color. The pixel or subpixel is generally used to designate the smallest addressable unit in a display panel. For a monochrome display, there is no distinction between pixel or subpixel. The term "subpixel" is used in multicolor display panels and is employed to designate any portion of a pixel which can be independently addressable to emit a specific color. For example, a blue subpixel is that portion of a pixel which can be addressed to emit blue light. In a full-color display, a pixel generally comprises three primary-color subpixels, namely blue, green, and red. The term "pitch" is used to designate the distance separating two pixels or subpixels in a display panel. Thus, a subpixel pitch means the separation between two subpixels.

Figure 1:
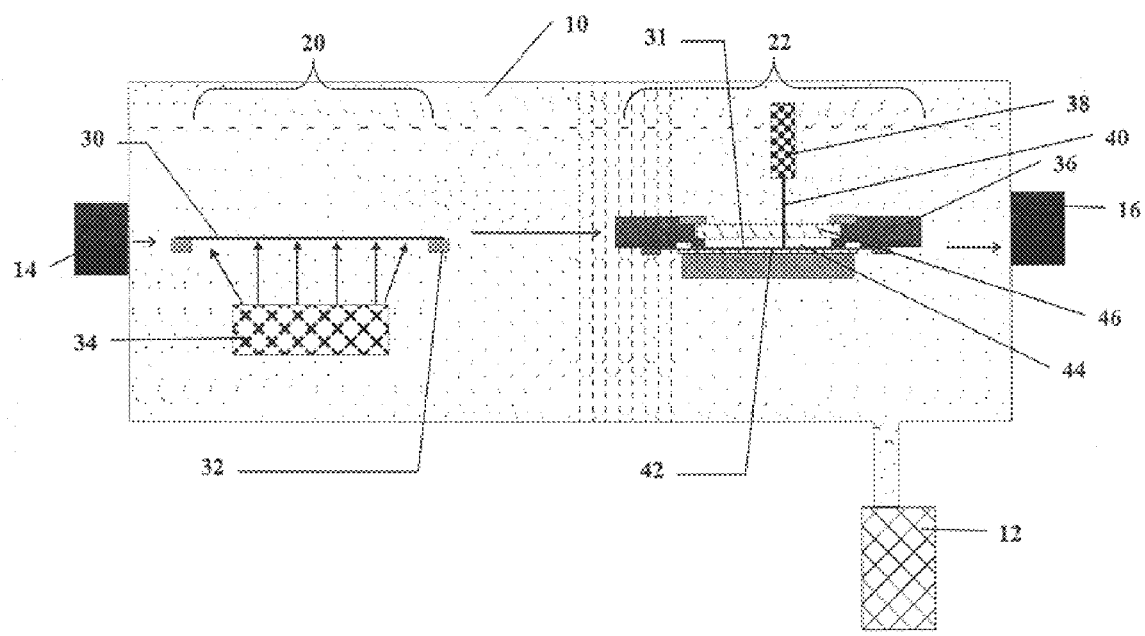
FIG. 1 is a cross-sectional representation of a first embodiment of the present invention in which the donor support element is coated and the transfer to the substrate is affected in the same vacuum coater.

FIG. 1 is a cross-sectional representation of one embodiment of the present invention in which a donor support element 30 is coated, and the transfer of the coating material to a receiver element 42 is affected in the same evacuated chamber. Vacuum coater 10 is an enclosed apparatus described herein that permits a donor support element 30 to be coated by means such as vapor deposition, and the coated material to be subsequently transfer red to a receiver element 42 such as by thermal transfer under vacuum conditions. Vacuum coater 10 can include one chamber, or any number of chambers which can be connected by load locks or similarly acting apparatus such as tunnels or buffer chambers, whereby donor elements and receiver elements can be transported without exposure to non-vacuum conditions. The term "vacuum" is used her in to designate a pressure of 1 Torr or less. Vacuum coater 10 is held under vacuum by vacuum pump 12. Vacuum coater 10 includes load lock 14, which is used to load the chamber with donor support elements 30. Vacuum coater 10 also includes load lock 16, which is used to unload used donor elements 31. Load locks 14 and 16 are means of introducing and removing materials from vacuum coater 10 without contaminating the conditions inside with the outside environment. The interior of vacuum coater 10 includes coating station 20 and transfer r station 2. Coating station 20 is a location within vacuum coater 10 that permits a donor support element 30 to be coated by means such as vapor deposition. Transfer station 22 is a location within vacuum coater 10 that facilitates the transfer of the coated material to a receiver element 42, such as by thermal transfer.

Donor support element 30 is introduce to vacuum coater 10 by means of load lock 14. Donor support element 30 is a element that can accept a coating layer by means such as vapor deposition or sputtering, and can subsequently transfer all or part of the coating such a by thermal transfer. Donor support element 30 can optionally be supported by donor support 32. Donor support element 30 is transferred by mechanical means to coating station 20. Coating station 20 includes coating apparatus 34. Coating apparatus 34 can consist of any apparatus capable of coating the materials in vacuum, including, but not limited to evaporation and sputtering. This can be, e.g., vapor deposition apparatus such as that described in U.S. Pat. No. 6,237,529 and U.S. patent application Ser. Nos. 09/843,489 filed Apr. 26, 2001 by Steven A. an Slyke et al.; Ser. No. 09/839,885 filed Apr. 20, 2001 by Steven A. Van Slyke, et al.; Ser. No. 09/839,886 filed Apr. 20,2001 by Michael A. Marcus, et al., the disclosures of which are incorporated herein by reference, or any other apparatus capable of coating the materials in a vacuum. If multiple materials are to be coated in a layer, e.g. a host and a dopant material, the materials can be mixed together and deposited from a single source, or alternatively multiple sources can be used with different materials loaded in each source. Additionally, multiple sources can be used at separate times within vacuum coater 10 to coat separate layers on donor support element 30 or on receiver element 42, or can be used to coat additional donor support elements 30. Coating apparatus 34 is activated (e.g., desired material is heated to vaporize it) and donor support element 30 is coated evenly with material, rendering it into donor element 31. Donor element 31 is an element coated with one or more coated layers that can subsequently be transferred in whole or in part such as by thermal transfer.

The donor support element 30 can be made of any of several materials or combinations of materials which meet at least the following requirements: donor support element 30 must be sufficiently flexible and possess adequate tensile strength to tolerate coating steps and roll-to-roll or stacked-sheet transport of the support in the practice of the invention. Donor support element 30 must be capable of maintaining the structural integrity during the radiation-to-heat-induced transfer step while pressurized on one side, and during any preheating steps contemplated to remove volatile constituents such as water vapor. Additionally, donor support element 30 must be capable of receiving on one surface a relatively thin coating of material, and of retaining this coating without degradation during anticipated storage periods of the coated support. Support materials meeting these requirements include, for example, metal foils, plastic foils, and fiber-reinforced plastic foils. While selecting of suitable support materials can rely on known engineering approaches it will be appreciated that certain aspects of a selected support material merit further consideration when configured as donor support element 30 useful in the practice of the invention. For example, donor support element 30 can require a multistep cleaning and surface preparation process prior to coating with material. If the support material is a radiation-transmissive material, the incorporation into donor support element 30 or onto a surface thereof, of a radiation-absorptive material can be advantageous to more effectively heat donor support element 30 and to provide a correspondingly enhanced transfer of material from donor element 3 to receiver element 42, when using a flash of radiation from a suitable radiation source such as laser light from a suitable laser.

A typical OLED device may contain the following layers, usually in this sequence: an anode, a hole-injecting layer, a hole-transporting layer, a light-emitting layer, an electron-transporting layer, and a cathode. The material coated onto donor support element 30 can be a hole-injecting material, a hole-transport material, an electron-transport material, a emissive material, a host material, an anode material, a cathode material, a radiation-absorptive material, or a combination of any of these materials. The material can be moisture- and/or oxygen-sensitive, which means that the presence of water, water vapor, or oxygen, can negatively affect the performance or quality of the material.

Hole-Injecting (HI) Material

While not always necessary, it is of the often useful that a hole-injecting layer be provided in an organic light-emitting display. The hole-injecting material can serve to improve the film formation property of subsequent organic layers and to facilitate injection of holes into the hole-transporting layer. Suitable materials for use in the hole-injecting layer include, but are no limited to, porphyrinic compounds as described in U.S. Pat. No. 4,720,432, and plasma-deposited fluorocarbon polymers as described in U.S. Pat. No. 6,208,075 B1. Alternative hole-injecting materials reportedly useful in organic EL devices are described in EP 0 891 121 A1 and EP 1,029,909 A1.

Hole-Transport (HT) Material

Hole-transport materials useful as coated material are well known to include compounds such as an aromatic tertiary amine, where the latter is understood to be a compound, containing at least on trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel, et al. U.S. Pat. No. 3,180,730. Other suitable triarylamines substituted with one or more vinyl radicals and/or comprising at least one active hydrogen containing group are disclosed by Brantley, et al. U.S. Pat. No. 3,567,450 and U.S. Pat. No. 3,658,520.

A more preferred class of aromatic tertiary amines are those which include at least two aromatic tertiary amine moieties as described in U.S. Pat. No. 4,720,432 and U.S. Pat. No. 5,061,569. Such compounds include those represented by structural formula (A):

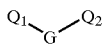

wherein:
- $Q_1$ and $Q_2$ are independently selected aromatic tertiary amine moieties; and
- G is a linking group such as an arylene, cycloalkylene, or alkylene group of a carbon to carbon bond.

In one embodiment, at least one of $Q_1$ or $Q_2$ contains polycyclic fused ring structure, e.g., a naphthalene. When G is an aryl group, it is conveniently a phenylene, biphenylene, or naphthalene moiety.

A useful class of triarylamines satisfying structural formula (A) and containing two triarylamine moieties is represented by structural formula (B):

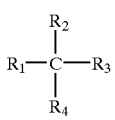

wherein:
- $R_1$ and $R_2$ each independently represents a hydrogen atom, an aryl group, or an alkyl group or $R_1$ and $R_2$ together represent the atoms completing a cycloalkyl group; and
- $R_3$ and $R_4$ each independently represents an aryl group, which is in turn substituted with a diaryl substituted amino group, a indicated by structural formula (C):

wherein:
- $R_5$ and $R_6$ are independently selected aryl groups. In one embodiment, at least one of $R_5$ or $R_6$ contain a polycyclic fused ring structure, e.g., a naphthalene.

Another class of aromatic tertiary amines is the tetraaryldiamines. Desirable tetraaryldiamines include two diarylamino groups, such as indicated by formula (C), linked through an arylene group. Useful tetraaryldiamines include those represented by formula (D).

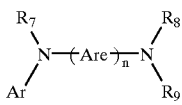

wherein:
- each Are is an independently selected arylene group, such as a phenylene or anthracene moiety;
- n is an integer of from 1 to 4, and
- Ar, $R_7$, $R_8$, and $R_9$ are independently selected aryl groups. In a typical embodiment, at least one of Ar, $R_7$, $R_8$, and $R_9$ is a polycyclic fused ring structure, e.g., a naphthalene.

The various alkyl, alkylene, aryl, and arylene moieties of the foregoing structural formulae (A), (B), (C), and (D), can each in turn be substituted. Typical substituents include alkyl group, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms—e.g., cyclopentyl, cyclohexyl, and cycloheptyl ring structures. The aryl and arylene moieties are usually phenyl and phenylene moieties.

The hole-transporting layer can be formed of a single or a mixture of aromatic tertiary amine compounds. Specifically one can employ a triarylamine, such as a triarylamine satisfying the formula (B), in combination with a tetraaryldiamine, such as indicated by formula (D). When a triarylamine is employed in combination with a tetraaryldiamine, the latter is positioned as a layer interposed between the triarylamine and the electron-injecting and transporting layer. Illustrative of useful aromatic tertiary amine are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N-Phenylcarbazole
Poly(N-vinylcarbazole), and
N,N'-di-1-naphthalenyl-N,N'-diphenyl-4,4'-diaminobiphenyl.
4,4'-Bis[N-(1-naphthyl)-N-phenylamino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalane
2,6-Bis[di-(1-naphthyl)amino]naphthalene
2,6-Bis[N-(1-naphthyl)-N-(2-naphthyl)amino]naphthalene
N,N,N',N'-Tetra(2-naphthyl)-4,4"-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorine
1,5-Bis[N-(1-naphthyl)-N-phenylamino]naphthalene Another class of useful hole-transport materials includes polycyclic aromatic compounds as described in EP 1 009 041. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Material

Light-emitting materials useful as coated material are well known. As more fully described in U.S. Pat. No. 4,769,292 and 5,935,721, the light-emitting layer (LEL) of the organic EL element comprises a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below a hole-transporting material, as defined above, or another material that supports hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weigh into the host material.

An important relationship for choosing a dye as a dopant is a comparison of the bandgap potential which is defined s the energy difference between the highest occupied molecular orbital and the lowest unoccupied molecular orbital of the molecule. For efficient energy transfer from the host to the dopant molecule, a necessary condition is that the ban gap of the dopant is smaller than that of the host material.

Host and emitting molecules known to be of use include, but are not limited to, those disclosed in U.S. Pat. Nos. 4,768,29; 5,141,671; 5,150,006; 5,151,629; 5,294,870; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline and similar derivatives (Formula E) constitute one class of useful host compounds capable of supporting electroluminescence, and are particularly suitable for light emission of wavelengths longer than 500 nm, e.g green, yellow, orange, and red.

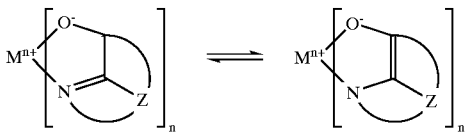

E wherein:
M represents a metal;
n is an integer of from 1 to 3; and
Z independently in each occurrence represents the atoms completing a nucleus having at least two fused aromatic rings.

From the foregoing it is apparent that the metal can be monovalent, divalent, or trivalent metal. The metal can, for example, be an alkali metal, such as lithium, sodium, or potassium; an alkaline earth metal, such as magnesium or calcium; or an earth metal, such as boron or aluminum. Generally any monovalent, divalent, or trivalent metal known to be a useful chelating metal can be employed.

Z completes a heterocyclic nucleus containing at least two fused aromatic rings, at least one of which is an azole or azine ring. Additional rings, including both aliphatic and aromatic rings, can be fused with the two required rings, if required. To avoid adding molecular bulk without improving on function the number of ring atoms is usually maintained at 18 or less.

Illustrative of useful chelated oxinoid compounds are the following:

CO-1: Aluminum trisoxine [alias, tris(8-quinolinolato) aluminum(III)]
CO-2: Magnesium bisoxine [alias, bis(8-quinolinolato) magnesium(II)]
CO-3: Bis[benzo{f}-8-quinolinolato]zinc(II)
CO-4: Bis(2-methyl-8-quinolinolato)aluminum(III)-μ-oxo-bis(2-methyl-8-quinolinolato) aluminum(III)
CO-5: Indium trisoxine [alias, tris(8-quinolinolato) indium]
CO-6: Aluminum tris(5-methyloxine)[alias, tris(5-methyl-8-quinolinolato)aluminum(III)]
CO-7: Lithium oxine [alias, (8-quinolinolato)lithium(I)]

Derivatives of 9,10-di-(2-naphthyl)anhracene (Formula F) constitute one class of useful hosts capable of supporting electroluminescence, and are particularly suitable for light emission of wavelengths longer than 400 nm, e.g. blue, green, yellow, orange or red.

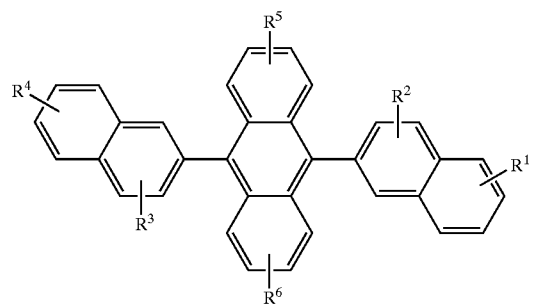

F wherein:
$R^1$, $R^2$, $R^3$, and $R^4$ represent one or more substituents on each ring where each substituent is individually selected from the following groups:
Group 1: hydrogen, or alkyl of from 1 to 24 carbon atoms;
Group 2: aryl or substituted aryl of from 5 to 20 carbon atoms;
Group 3: carbon atoms from 4 to 24 necessary to complete a fused aromatic ring of anthracenyl; pyrenyl, or perylenyl;
Group 4: heteroaryl or substituted heteroaryl of from 5 to 24 carbon atoms as necessary to complete a fused heteroaromatic ring of furyl, thienyl, pyridyl, quinolinyl or other heterocyclic systems;
Group 5: alkoxylamino, alkylamino, or arylamino of from 1 to 24 carbon atoms; and
Group 6: fluorine, chlorine, bromine or cyano.

Benzazole derivatives (Formula G) constitute another class of useful hosts capable of supporting electroluminescene, and are particularly suitable for light emission of wavelengths longer than 400 nm, e.g. blue, green, yellow, orange or red.

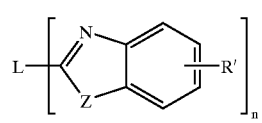

G wherein:
n is an integer of 3 to 8;
Z is O, NR or S;
R' is hydrogen; alkyl of from 1 to 24 carbon atoms, for example, propyl, t-butyl, heptyl, and the like; aryl or hetero-atom substituted aryl of from 5 to 20 carbon atoms for example phenyl and naphthyl, furyl thienyl, pyridyl, quinolinyl and other heterocyclic systems, or halo such as chloro, fluoro; or atoms necessary to complete a fused aromatic ring; and
L is a linkage unit consisting of alkyl, aryl, substituted alkyl, or substituted aryl, which conjugately or unconjugately connects the multiple benzazoles together.

An example of a useful benzazole is 2,2',2"-(1,3,5-phenylene)tris[1-phenyl-1H-benzimidazole].

Desirable fluorescent dopants include derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, and carbostyryl compounds. Illustrative examples of useful dopants include, but are not limited to, the following:

L1
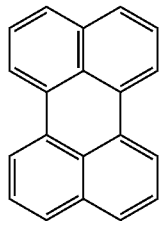

L2
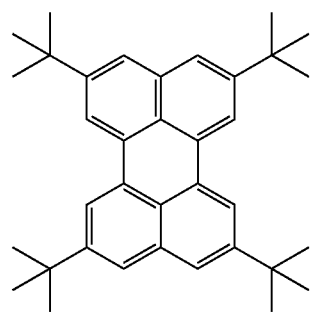

L3
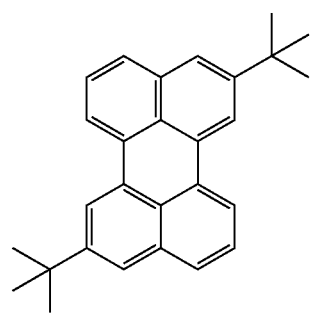

L4
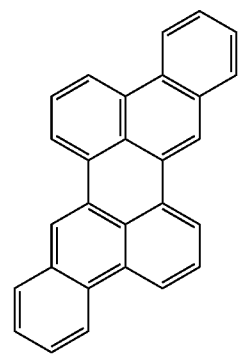

-continued

L5
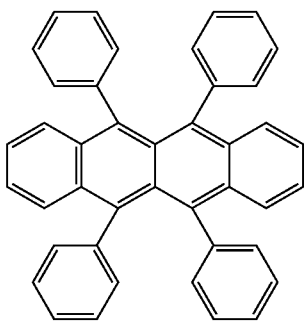

L6
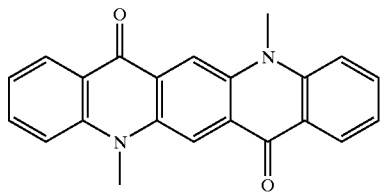

L7
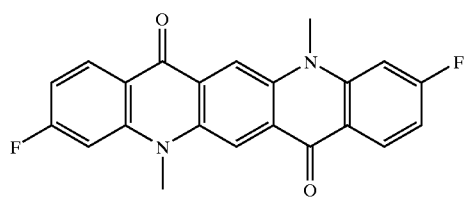

L8
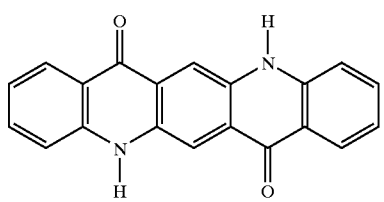

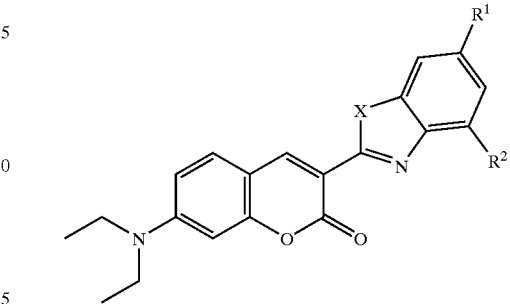

-continued

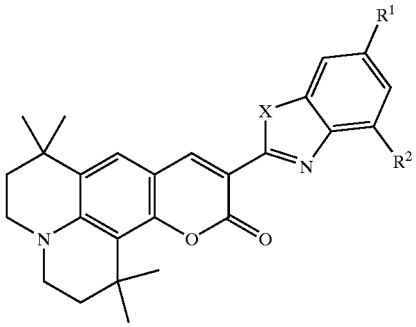

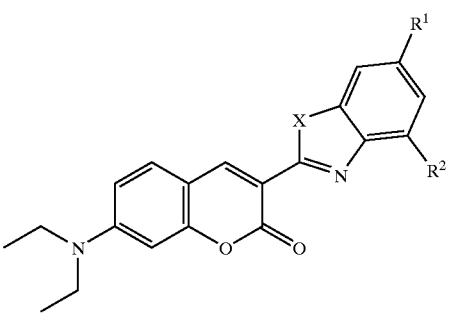

| | X | R1 | R2 |
|---|---|---|---|
| L9 | O | H | H |
| L10 | O | H | Methyl |
| L11 | O | Methyl | H |
| L12 | O | Methyl | Methyl |
| L13 | O | H | t-butyl |
| L14 | O | t-butyl | H |
| L15 | O | t-butyl | t-butyl |
| L16 | S | H | H |
| L17 | S | H | Methyl |
| L18 | S | Methyl | H |
| L19 | S | Methyl | Methyl |
| L20 | S | H | t-butyl |
| L21 | S | t-butyl | H |
| L22 | S | t-butyl | t-butyl |

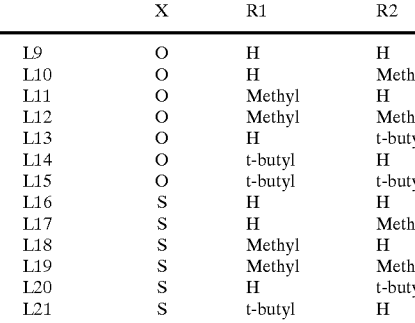

| | X | R1 | R2 |
|---|---|---|---|
| L23 | O | H | H |
| L24 | O | H | Methyl |
| L25 | O | Methyl | H |
| L26 | O | Methyl | Methyl |
| L27 | O | H | t-butyl |
| L28 | O | t-butyl | H |
| L29 | O | t-butyl | t-butyl |
| L30 | S | H | H |
| L31 | S | H | Methyl |
| L32 | S | Methyl | H |
| L33 | S | Methyl | Methyl |
| L34 | S | H | t-butyl |
| L35 | S | t-butyl | H |
| L36 | S | t-butyl | t-butyl |

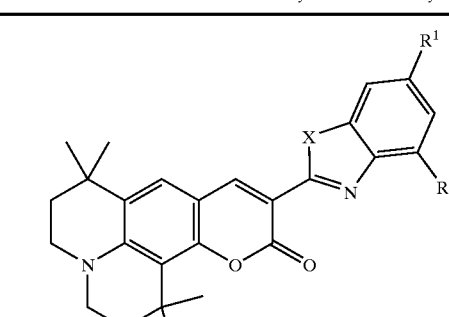

| | R |
|---|---|
| L37 | phenyl |
| L38 | methyl |
| L39 | t-butyl |
| L40 | mesityl |

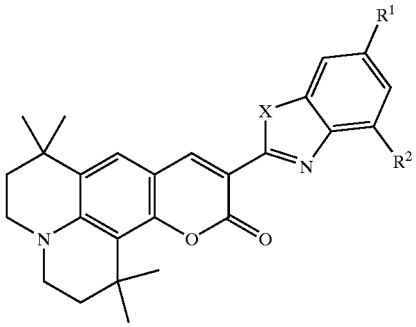

| | R |
|---|---|
| L41 | phenyl |
| L42 | methyl |
| L43 | t-butyl |
| L44 | mesityl |

L45

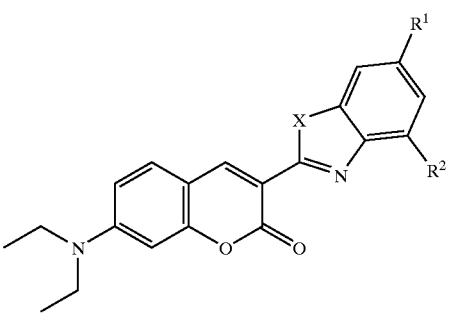

L46

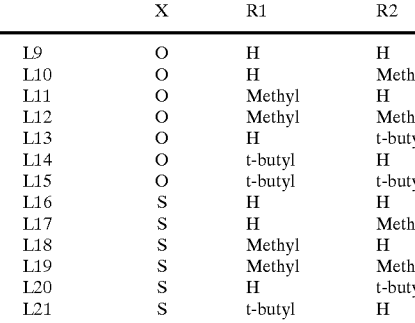

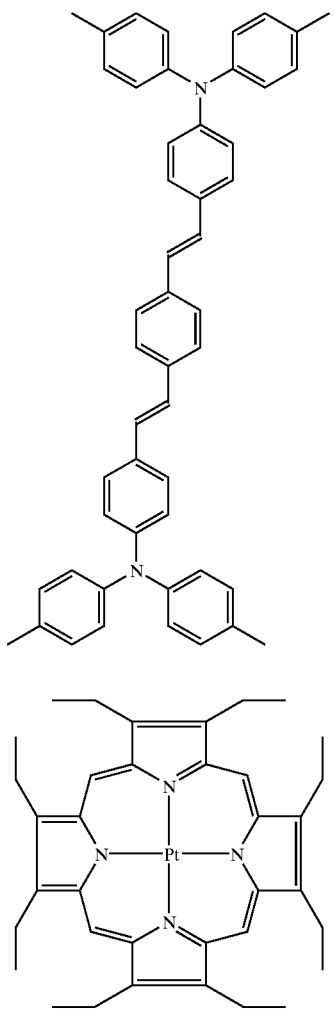

L47

L48

Other organic emissive materials can be polymeric substances, e.g. polyphenylenevinylene derivatives, dialkoxy-polyphenylenevinylenes, poly-para-phenylene derivatives, and polyfluorene derivatives, as taught by Wolk, et al. in commonly assigned U.S. Pat. No. 6,194,119 B1 and references therein.

Electron-Transport (ET) Material

Preferred electron-transport materials for use in organic EL devices of the present invention are metal chelated oxinoid compounds, including chelates of oxine itself (also commonly referred to as 8-quinolinol or 8-hydroxyquinoline). Such compounds help to inject and transport electrons and exhibit both high levels of performance and are readily fabricated in the form of thin films. Exemplary of contemplated oxinoid compounds are those satisfying structural formula (E), previously described.

Other electron-transporting materials include various butadiene derivatives as disclosed in U.S. Pat. No. 4,356,429 and various heterocyclic optical brighteners as described in U.S. Pat. No. 4,539,507. Benzazoles satisfying structural formula (I) are also useful electron-transporting materials.

Other electron-transport materials can be polymeric substances, e.g. polyphenylenevinylene derivatives, poly-para-phenylene derivatives, polyfluorene derivatives, polythiophenes, polyacetylenes, and other conductive polymeric organic materials such as those listed in *Handbook of Conductive Molecules and Polymers*, Vols. 1–4, H. S. Nalwa, ed., John Wiley and Sons, Chichester (1997).

In some instances, a single layer can serve the function of supporting both light emission and electron-transportation, and will therefore include emissive material and electron-transport material.

Anode Material

The conductive anode layer is formed over the substrate and, when EL emission is viewed through the anode, should be transparent or substantially transparent to the emission of interest. Common transparent anode materials used in the present invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as an anode material. For applications where EL emission is viewed through the top electrode, the transmissive characteristics of the anode material are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials can be deposited by any suitable means such as evaporation, sputtering, chemical vapor deposition, or electrochemical means. Anode materials can be patterned using well known photolithographic processes.

Cathode Material

When light emission is through the anode, the cathode material can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprised of a thin layer of a low work function metal or metal salt capped with a thicker layer of conductive metal. One such cathode is comprised of a thin layer of LiF followed by a thicker layer of Al as described in U.S. Pat. No. 5,677,572. Other useful cathode materials include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 5,776,623. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition.

Radiation-Absorptive Material

Radiation-absorbing material can be a dye such as the dyes specified in commonly assigned U.S. Pat. No. 5,578,416, a pigment such as carbon, or a metal such as nickel, chromium, titanium, etc.

Receiver element 42 is introduced to vacuum coater 10 by means of load lock 16 and transferred by mechanical means to transfer apparatus 36. This can occur before, after, or during the introduction of donor support element 30. Transfer apparatus 36 can consist of any apparatus capable of facilitating the transfer of coated materials on donor element 31 in a vacuum, in response to heat or radiation converted to heat. One example of transfer apparatus 36, its construction, and its means of operation with donor element 31 and receiver element 42 have already been described in U.S. patent application Ser. No. 6/021,410 filed Dec. 12, 2001 by Phillips, et al.; the disclosure of which is incorporated herein by reference. Transfer apparatus 36 is shown for convenience in the closed configuration, but it also has an open configuration in which donor element 31 and receiver element 42 loading and unloading occurs. Donor element 31 is transferred by mechanical means from coating station 20 to transfer station 22. Donor element 31 and receiver element 42 are placed in a material transferring relationship, that is, the coated side of donor element 31 is placed in close contact with the receiving surface of receiver element 42 and held in place by a means such as fluid pressure in pressure chamber 44, as described by Phillips, et al. Donor element 31 can then be irradiated through transparent portion 46 by applied radiation, such as by laser beam 40 from laser 38. The irradiation of donor element 31 in a pattern causes the transfer of coated material from donor element 31. to receiver element 42, as described by Phillips, et al.

Receiver element 42 can be an organic solid, an inorganic solid, or a combination of organic and inorganic solids that provides a surface for receiving the emissive material from a donor. Receiver element 42 can be rigid or flexible and can be processed as separate individual pieces, such as sheets or wafers, or as a continuous roll. Typical receiver element materials include glass, plastic, metal, ceramic, semiconductor, metal oxide, semiconductor oxide, semiconductor nitride, or combinations thereof. Receiver element 42 can be a homogeneous mixture of materials, a composite of materials, or multiple layers of materials. The receiver element 42 can either be light transmissive or opaque, depending on the intended direction of light emission. The light transmissive property is desirable for viewing the EL emission through receiver element 42. Transparent glass or plastic are commonly employed in such cases. For applications where the EL emission is viewed through the top electrode, the transmissive characteristic of receiver element 42 is immaterial, and therefore can be light transmissive, light absorbing or light reflective. Receiver elements for use in this case include, but are not limited to, glass, plastic, semiconductor materials, ceramics, and circuit board materials. Receiver element 42 can be treated with one or more layers of the above-described materials (e.g. an anode material, a cathode material, a hole-transport material, etc.) before undergoing the method herein. Receiver element 42 can further be treated with one or more layers of the above described materials (e.g. an anode material, a cathode material, an electron-transport material, etc.) and with protective layers after undergoing the method herein. These treatments can be affected outside of vacuum coater 10 or inside vacuum coater 10 at coating station 20.

After irradiation is complete, transfer apparatus 36 is opened and donor element 31 and receiver element 42 can be removed via load lock 16.

Figure 2:
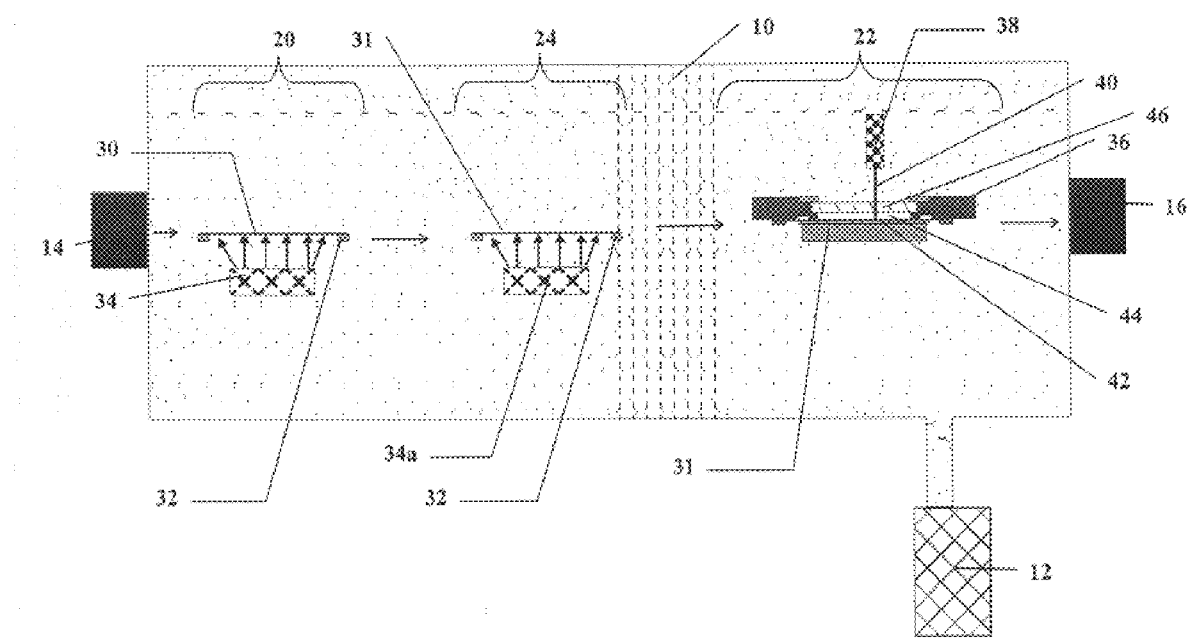
FIG. 2 is a cross-sectional representation of another embodiment of the present invention in which the donor support element is coated with more than one layer and the transfer to the substrate is affected in the same vacuum coater.

FIG. 2 is a cross-sectional representation of another embodiment of the present invention in which the donor support element is coated with more than one layer and the transfer to the substrate is affected in the same evacuated chamber. Vacuum coater 10 is held under vacuum by vacuum pump 12. Vacuum coater 10 includes load lock 14, which is used to load the chamber with fresh donor support elements. Vacuum coater 10 also includes load lock 16, which is used to unload used donor elements. The interior of vacuum coater 10 includes coating station 20, coating station 24, and transfer station 22.

Donor support element 30 is introduced to vacuum coater 10 by means of load lock 14. Donor support element 30 can optionally be supported by donor support 32. Donor support element 30 is transferred by mechanical means to coating station 20, which includes coating apparatus 34. Coating apparatus 34 is activated (e.g. desired coating material is heated to vaporize it) and donor support element 30 is coated evenly with coating material, rendering it into donor element 31.

Donor element 31 is transferred by mechanical means from coating station 20 to coating station 24, which includes coating apparatus 34a. Coating apparatus 34a is activated (e.g. desired coating material is heated to vaporize it) and donor element 31 is coated evenly with an additional layer of coating material.

Receiver element 42 is introduced to vacuum coater 10 by means of load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occurs. Donor support element 31 is transferred by mechanical means from coating station 24 to transfer station 22. Donor element 31 and receiver element 42 are placed in a material transferring relationship, that is, the coated side of donor element 31 is placed in close contact with the receiving surface of receiver element 42 and held in place by fluid pressure in pressure chamber 44 as described in Phillips, et al. Donor element 31 is then irradiated through transparent portion 46 by applied radiation such as by laser beam 40 from laser 38. The irradiation of donor element 31 in a pattern causes the transfer of coated material from donor element 31 to receiver element 42, as described by Phillips, et al.

After irradiation is complete, transfer apparatus 36 is opened and donor element 31 and receiver element 42 can be removed via load lock 16.

While this embodiment illustrates the coating and transfer of two layers, it will readily be apparent to those skilled in the art that three or more layers can be coated and transferred in this way.

Alternatively, the embodiment in, FIG. 2 can be used to transfer more than one layer to the receiver element in different patternwise transfers. In this method, a plurality of donor support elements 30 are introduced to vacuum coater 10 such that each coating station 20 and 24 is provided with a unique donor support element 30. Each donor support element 30 is coated evenly with coating material by its respective coating apparatus, thus rendering each into a unique donor element 31.

In this embodiment, each donor element 31 is transferred sequentially by mechanical means from its respective coating station (20 or 24) to transfer station 22. Receiver element 42 is introduced to vacuum coater 10 by means of load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occurs. Donor element 31 and receiver element 42 are placed in a material transferring relationship, that is, the coated side of donor element 31 is placed in close contact with the receiving surface of receiver element 42 and held in place by fluid pressure in pressure chamber 44 as described in Phillips, et al. Donor element 31 is then irradiated through transparent portion 46 by applied radiation such as by laser beam 40 from laser 38. The irradiation of donor element 31 in a pattern causes the transfer of coated material from donor element 31 to receiver element 42, as described by Phillips, et al.

After irradiation is complete, transfer apparatus 36 is opened and donor element 31 can be removed via load lock 16. The second donor element 31 is transferred by mechanical means to transfer station 22 and the transfer process is repeated. The transfer process in the several transfer operations can follow the same pattern of laser irradiation, or each transfer can be affected using a different pattern of laser irradiation.

It will be clear to those skilled in the art that this process can be used in the manufacture of a full-color display device, such as a full-color OLED device. Such devices generally are comprised of red, green, and blue subpixels. A vacuum coater 10 with three coating stations can be used to prepare the required donor elements 31. Each donor element 31 is prepared with a coating of a different organic emissive layer to reflect the desired output color or hue, that is with either a red, blue, or green emissive layer. Each donor element 31 is transferred sequentially by mechanical means from its respective coating station to transfer station 22, sequentially positioned in a material transferring relationship to receiver element 42, and radiation is sequentially applied through transparent portion 46 by such means as laser beam 40 from laser 38. The irradiation of donor element 31 in a pattern causes the patternwise transfer of coated material from donor element 31 to receiver element 42, as described by Phillips, et al. For example, the red emissive material is transferred patternwise to the red subpixels, the blue emissive material is transferred patternwise to the blue subpixels, and the green emissive material is transferred patternwise to the green subpixels. Receiver element 42 can be treated with one or more layers of materials (e.g. an anode material, a cathode material, a hole-transport material, etc.) before undergoing the method herein. Receiver element 42 can further be treated with one or more layers of materials (e.g. an anode material, a cathode material, an electron-transport material, etc.) and with protective layers after undergoing the method herein. These treatments can be affected outside of vacuum coater 10 or inside vacuum coater 10 at coating station 20.

Figure 3:
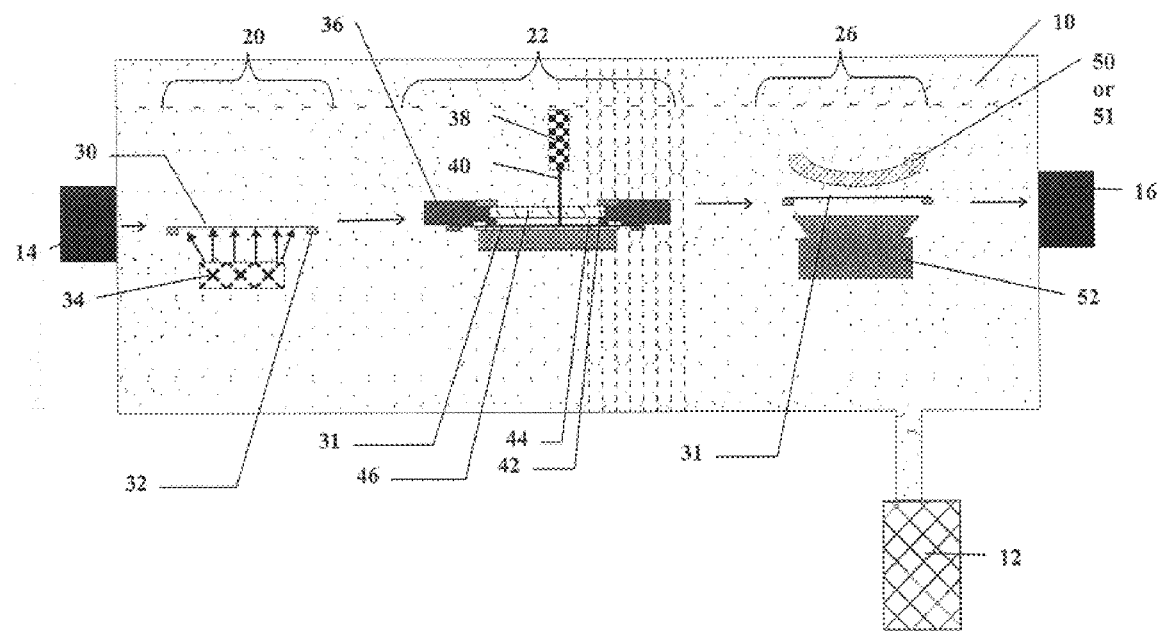
FIG. 3 is a cross-sectional representation of another embodiment of the present invention in which the donor support element is coated, the transfer to the substrate is affected, and remaining coated material on the donor element is removed in the same vacuum coater.

FIG. 3 is a cross-sectional representation of another embodiment of the present invention in which the donor support element is coated, the transfer to the substrate is affected, and remaining coated material on the donor element is removed in the same evacuated chamber. Vacuum coater 10 is held under vacuum by vacuum pump 12. Vacuum coater 10 includes load lock 14, which is used to load the chamber with fresh donor support elements. Vacuum coater 10 also includes load lock 16, which is used to unload used donor elements. The interior of vacuum coater 10 includes coating station 20, transfer station 22, and cleaning station 26.

Donor support element 30 is introduced to vacuum coater 10 by means of load lock 14. Donor support element 30 can optionally be supported by donor support 32. Donor support element 30 is transferred by mechanical means to coating station 20, which includes coating apparatus 34. Coating apparatus 34 is activated (e.g. desired coating material is heated to vaporize it) and donor 30 is coated evenly with coating material, rendering it into donor element 31.

Receiver element 42 is introduced to vacuum coater 10 by means of load lock 14 or load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occurs. Donor support element 31 is transferred by mechanical means from coating station 20 to transfer station 22. Donor element 31 and receiver element 42 are placed in a material transferring relationship, that is, the coated side of donor element 31 is placed in close contact with the receiving surface of receiver element 42 and held in place by fluid pressure in pressure chamber 44, as described in Phillips, et al. Donor element 31 is then irradiated through transparent portion 46 by applied radiation, such as by laser beam 40 from laser 38. The irradiation of donor element 31 in a pattern causes the transfer of coated material from donor element 31 to receiver element 42, as described by Phillips, et al.

After irradiation is complete, transfer apparatus 36 is opened and receiver element 42 can be removed via load lock 16 or load lock 14. Donor element 31 is transferred by mechanical means to cleaning station 26. Cleaning station 26 is a location within vacuum coater 10 that permits a means for removing coated material from donor element 31 so that donor support element 30 can be reused. Cleaning station 26 includes heater 50 or a radiation source such as flash lamp 51 and vapor removal means 52. Donor element 31 is heated by heater 50 or a radiation source such as flash lamp 51 in the process of cleaning it, that is, heating or radiation causes coated material of donor element 31 to vaporize or sublime and be removed by vapor remover 52. Vapor remover 52 may be e.g. a vacuum port inlet, a cold trap, a removable shield, etc. Donor element 31 is now donor support element 30 and can be removed by mechanical means via load lock 16. Alternatively, donor support element 30 can be transferred by mechanical means to coating station 20 to be recoated and reused.

These operations can be simultaneous at the various stations. For example, a donor element 31 can be used in a radiation-induced transfer at transfer station 22, while a previously transferred donor element 31 is being heated or irradiated at cleaning station 26 and an uncoated donor support element 30 is being coated at coating station 20.

Figure 4:
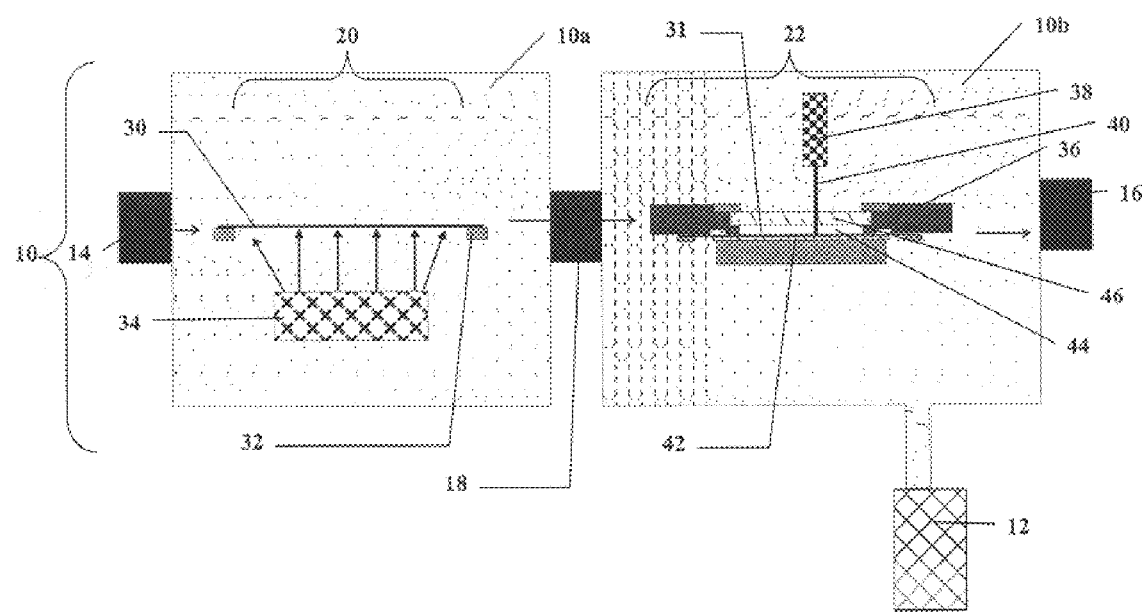
FIG. 4 is a cross-sectional representation of another embodiment of the present invention in which the donor support element is coated and the transfer to the substrate is affected in a vacuum coater composed of two chambers joined by a load lock.

FIG. 4 is a cross-sectional representation of another embodiment of the present invention in which the donor support element is coated and the transfer to the substrate is affected in different connected evacuated chambers. Vacuum coater 10 in this embodiment includes coating chamber 10a and transfer chamber 10b. Both are held under vacuum by vacuum pump 12 and are connected by load lock 18. Vacuum coater 10 includes load lock 14, which is used to load the chamber with fresh uncoated donor elements. Vacuum coater 10 also includes load lock 16, which is used to unload used donor elements. The interior of vacuum coater 10 includes coating station 20 in coating chamber 10a and transfer station 22 in transfer chamber 10b.

Donor support element 30 is introduced to coating chamber 10a of vacuum coater 10 by means of load lock 14. Donor support element 30 can optionally be supported by donor support 32. Donor support element 30 is transferred by mechanical means to coating station 20, which includes coating apparatus 34. Coating apparatus 34 is activated (e.g. desired coating material is heated to vaporize it) and donor 30 is coated evenly with coating material, rendering it into donor element 31.

Receiver element 42 is introduced to transfer chamber 10b of vacuum coater 10 by means of load lock 16 and transferred by mechanical means to transfer apparatus 36. This can occur before, after, or during the introduction of donor support element 30. Transfer apparatus 36 is shown for convenience in the closed configuration, but it also has an open configuration in which the donor element and substrate loading and unloading occur. Donor element 31 is transferred by mechanical means from coating station 20 through load lock 18 to transfer station 22. Donor element 31 and receiver element 42 are placed in a material transferring relationship, that is, the coated side of donor element 31 is placed in close contact with the receiving surface of receiver element 42 and held in place by a means such as fluid pressure in pressure chamber 44, as described by Phillips, et al. Donor element 31 is then irradiated through transparent portion 46 by applied radiation, such as by laser beam 40 from laser 38. The irradiation of donor element 31 in a pattern causes the transfer of coated material from donor element 31 to receiver element 42, as described by Phillips, et al.

After irradiation is complete, transfer apparatus 36 is opened and donor element 31 and receiver element 42 can be removed via load lock 16. Alternatively, donor element 31 can be removed via load lock 16 while receiver element 42 is left in place. The transfer process can then be repeated using receiver element 42 and a new donor element 31.

It will be clear that variations on this procedure can be affected. Receiver element 42 can be coated at coating station 20 with additional layers of materials useful in OLED fabrication. Such coating can occur before, after, or both before and after the radiation-induced transfer. For example, a receiver element 42 can have successively applied to it a hole-transport material at coating station 20, an emissive material at transfer station 22, and an electron-transport material at coating station 20.

Figure 5:
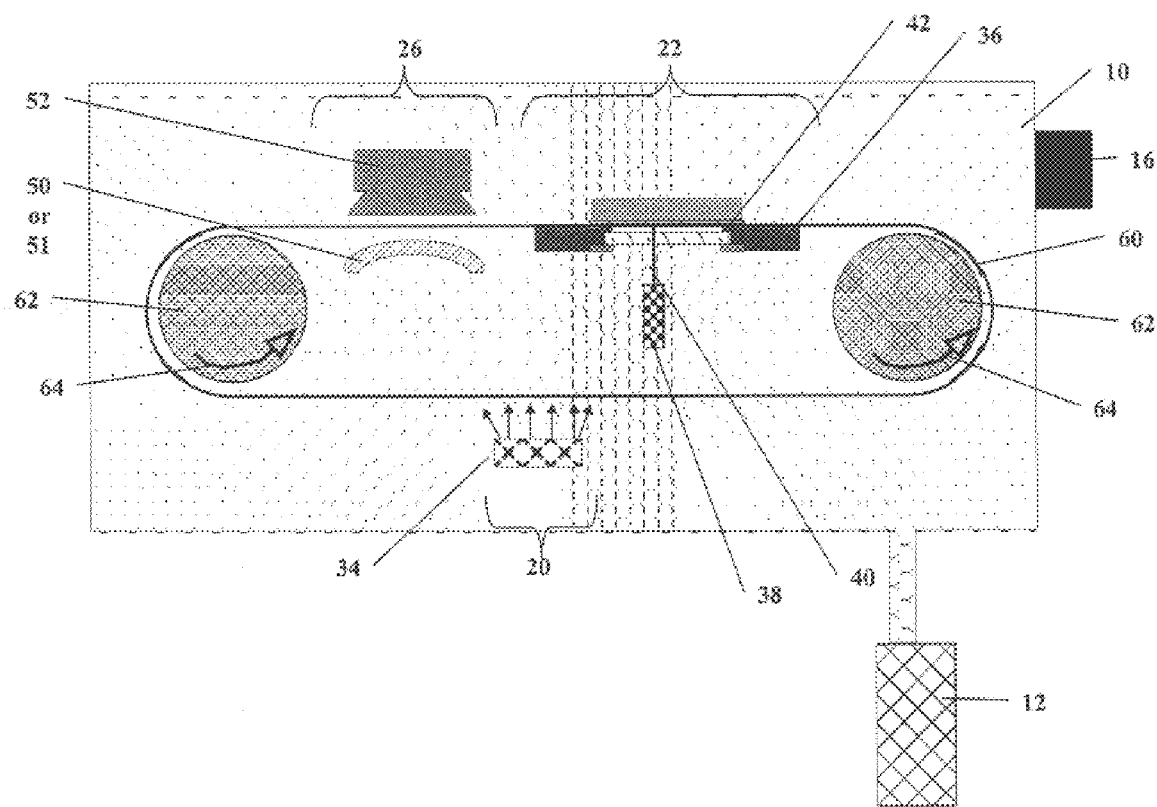
FIG. 5 is a cross-sectional representation of another embodiment of the present invention in which the donor support element forms a continuous sheet that is coated, the transfer to the substrate is affected, and remaining coated material on the donor element is removed in the same vacuum coater.

FIG. 5 is a cross-sectional representation of another embodiment of the present invention in which the donor element is part of a continuous web, that is, it forms a continuous sheet that is coated, the transfer to the substrate is affected, and remaining coated material on the donor element is removed in the same evacuated chamber. Vacuum coater 10 is held under vacuum by vacuum pump 12. Vacuum coater 10 includes load lock 16, which is used to load and unload substrate. The interior of vacuum coater 10 includes moveable web 60, which is a continuous sheet of donor support element 30. Moveable web 60 is held on wheels 62 that turn in direction of travel 64. The interior of vacuum coater 10 also includes coating station 20, transfer station 22, and cleaning station 26 arrayed along the path of moveable web 60.

Moveable web 60 is rotated by means of wheels 62 when transfer apparatus 36 is in the open configuration. An uncoated portion of moveable web 60 is moved into coating station 20, which includes coating apparatus 34. Coating apparatus 34 is activated (e.g. desired coating material is heated to vaporize it) and a part of moveable web 60 is coated evenly with coating material. Thus, a part of moveable web 60 has become donor element 31.

Receiver element 42 is introduced to vacuum coater 10 by means of load lock 16 and transferred by mechanical means to transfer apparatus 36. Transfer apparatus 36 is shown for convenience in the closed configuration, but it also has an open configuration in which the donor element and substrate loading and unloading occurs. Moveable web 60 is rotated by means of wheels 62 when transfer apparatus 36 is in the open configuration, which moves a coated portion of moveable web 60 from coating station 20 to transfer station 22. This can occur before, during, or after the introduction of receiver element 42. The coated side of moveable web 60 is placed in close contact with receiver element 42 and held in place by fluid pressure in pressure chamber 44, as described by Phillips, et al. Moveable web 60 is then irradiated through transparent portion 46 by applied radiation, such as by laser beam 40 from laser 38. The irradiation of a coated portion of moveable web 60 in a pattern by laser beam 40 causes the transfer of coated material from moveable web 60 to receiver element 42, as described by Phillips, et al.

After irradiation is complete, transfer apparatus 36 is opened and receiver element 42 is removed via load lock 16. Moveable web 60 is rotated by means of wheels 62 when transfer apparatus 36 is in the open configuration, which moves the used coated portion of moveable web 60 from transfer station 22 to cleaning station 26. Cleaning station 26 includes heater 50 or a radiation source such as flash lamp 51 and vapor removal means 52. A portion of moveable web 60 is heated by heater 50 or a radiation source such as flash lamp 51, which cleans it, that is, it causes coated material of a coated portion of moveable web 60 to vaporize or sublime and be removed by vapor remover 52. Moveable web 60 is rotated by means of wheels 62 when transfer apparatus 36 is in the open configuration, which moves the now-uncoated portion of moveable web 60 from cleaning station 26 to coating station 20 for recoating and reuse.

These operations can be simultaneous at the various stations. For example, a portion of moveable web 60 can be used in a radiation-induced transfer at transfer station 22, while a previously transferred portion of moveable web 60 is being heated or irradiated at cleaning station 26 and an uncoated portion of moveable web 60 is being coated at coating station 20.

In an alternate embodiment, moveable web 60 can be a long, but not continuous sheet. This can be accomplished by the use of unwind and take-up rolls before and after the various stations.

Figure 6:
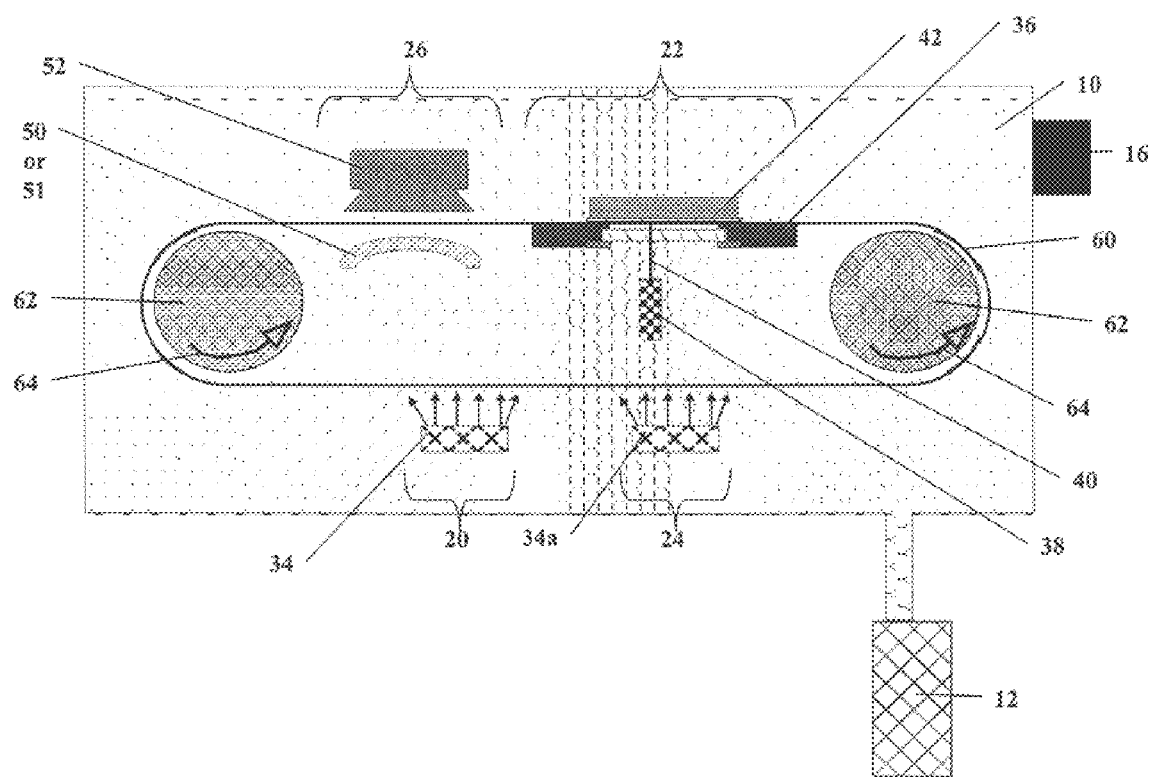
FIG. 6 is a cross-sectional representation of another embodiment of the present invention in which the donor support element forms a continuous sheet that is coated with more than one layer, the transfer to the substrate is affected, and remaining coated material on the donor element is removed in the same vacuum coater.

FIG. 6 is a cross-sectional representation of another embodiment of the present invention in which the donor element forms a continuous sheet that is coated with more than one layer, the transfer to the substrate is affected, and remaining coated material on the donor element is removed in the same evacuated chamber. Vacuum coater 10 is held under vacuum by vacuum pump 12. Vacuum coater 10 includes load lock 16, which is used to load and unload substrate. The interior of vacuum coater 10 includes moveable web 60, which is a continuous sheet of donor support element 30. Moveable web 60 is held on wheels 62 that turn in direction of travel 64. The interior of vacuum coater 10 also includes coating station 20, transfer station 22, and cleaning station 26 arrayed along the path of moveable web 60.

Moveable web 60 is rotated by means of wheels 62 when transfer apparatus 36 is in the open configuration. An uncoated portion of moveable web 60 is moved into coating station 20, which includes coating apparatus 34. Coating apparatus 34 is activated (e.g. desired coating material is heated to vaporize it) and a part of moveable web 60 is coated evenly with coating material. Thus, a part of moveable web 60 has become donor element 31.

Moveable web 60 is rotated by means of wheels 62 when transfer apparatus 36 is in the open configuration. A once-coated portion of moveable web 60 is moved from coating station 20 to coating station 24. Coating apparatus 34 is activated (e.g. desired coating material is heated to vaporize it) and moveable web 60 is coated evenly with a second layer of coating material.

Receiver element 42 is introduced to vacuum coater 10 by means of load lock 16 and transferred by mechanical means to transfer apparatus 36. Transfer apparatus 36 is shown for convenience in the closed configuration, but it also has an open configuration in which the donor element and substrate loading and unloading occurs. Moveable web 60 is rotated by means of wheels 62 when transfer apparatus 36 is in the open configuration, which moves a coated portion of moveable web 60 from coating station 20 to transfer station 22. This can occur before, during, or after the introduction of receiver element 42. The coated side of moveable web 60 is placed in close contact with receiver element 42 and held in place by fluid pressure in pressure chamber 44, as described by Phillips, et al. Moveable web 60 is then irradiated through transparent portion 46 by applied radiation, such as by laser beam 40 from laser 38. The irradiation of a coated portion of moveable web 60 in a pattern by laser beam 40 causes the transfer of coated material from moveable web 60 to receiver element 42, as described by Phillips, et al.

After irradiation is complete, transfer apparatus 36 is opened and receiver element 42 is removed via load lock 16. Moveable web 60 is rotated by means of wheels 62 when transfer apparatus 36 is in the open configuration, which moves the used coated portion of moveable web 60 from transfer station 22 to cleaning station 26. Cleaning station 26 includes heater 50 or a radiation source such as flash lamp 51 and vapor removal means 52. A portion of moveable web 60 is heated by heater 50 or a radiation source such as flash lamp 51, which causes coated material of a coated portion of moveable web 60 to vaporize or sublime and be removed by vapor remover 52. Moveable web 60 is rotated by means of wheels 62 when transfer apparatus 36 is in the open configuration, which moves the now-uncoated portion of moveable web 60 from cleaning station 26 to coating station 20 for recoating and reuse.

While this embodiment illustrates the coating and transfer of two layers, it will readily be apparent to those skilled in the art that three or more layers can be coated and transferred in this way.

Alternatively, the embodiment in FIG. 6 can be used to transfer more than one layer to the receiver element in different patternwise transfers. In this method, each coating station 20 and 24 coats a different part of moveable web 60, thus rendering different portions of the web into a unique donor element 31.

In this embodiment, each coated portion of moveable web 60 is transferred sequentially from its respective coating station (20 or 24) to transfer station 22. Receiver element 42 is introduced to vacuum coater 10 by means of load lock 16 and transferred by mechanical means to transfer apparatus 36. The coated portion of moveable web 60 and receiver element 42 are placed in a material transferring relationship, that is, the coated side of moveable web 60 is placed in close contact with the receiving surface of receiver element 42 and held in place by fluid pressure in pressure chamber 44 as described in Phillips, et al. Moveable web 60 is then irradiated through transparent portion 46 by applied radiation such as by laser beam 40 from laser 38. The irradiation of the coated portion of moveable web 60 in a pattern causes the transfer of coated material from moveable web 60 to receiver element 42, as described by Phillips, et al.

After irradiation is complete, transfer apparatus 36 is opened and a further coated portion of moveable web 60 is transferred to transfer station 22 and the transfer process is repeated. The transfer process in the several transfer operations can follow the same pattern of laser irradiation, or each transfer can be affected using a different pattern of laser irradiation such as in preparation of a full-color OLED device. Each of three coated portions of moveable web 60 is prepared with a coating of a different organic emissive layer to reflect the desired output color or hue, that is with either a red, blue, or green emissive layer. Each coated portion of moveable web 60 is transferred sequentially from its respective coating station to transfer station 22, sequentially positioned in a material transferring relationship to receiver element 42, and radiation is sequentially applied through transparent portion 46 by such means as laser beam 40 from laser 38. The irradiation of the coated portion of moveable web 60 in a pattern causes the patternwise transfer of coated material from moveable web 60 to receiver element 42, as described by Phillips, et al. For example, the red emissive material is transferred patternwise to the red subpixels, the blue emissive material is transferred patternwise to the blue subpixels, and the green emissive material is transferred patternwise to the green subpixels.

Figure 7A:
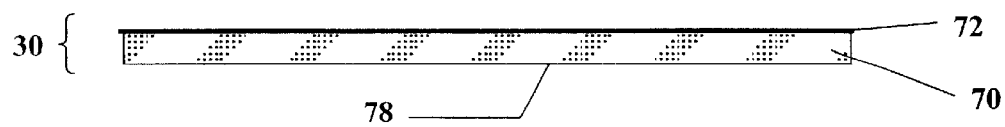
FIG. 7A is a cross-sectional representation of the structure of the uncoated donor element.

FIG. 7A is one example of a cross-sectional representation of the structure of an uncoated donor element. Donor support element 30 includes at the minimum a flexible support 70, which comprises non-transfer surface 78. Flexible support 70 has been uniformly coated with radiation-to-heat conversion layer 72. Radiation-to-heat conversion layer 72 includes material capable of absorbing radiation at the wavelength of interest and emitting heat.

Figure 7B:
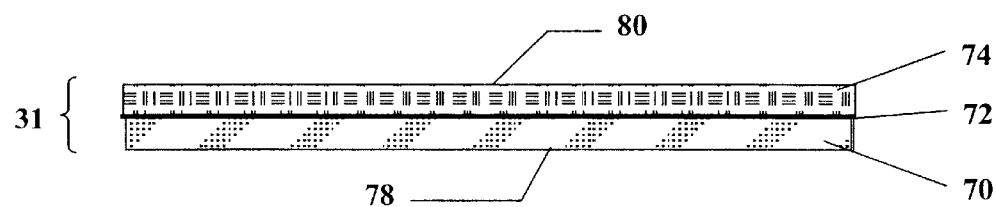
FIG. 7B is a cross-sectional representation of the structure of the donor element coated with one layer of coated material.

FIG. 7B is one example of a cross-sectional representation of the structure of a donor element coated with one layer of coated material. Donor element 31 includes flexible support 70, which comprises non-transfer surface 78. Flexible support 70 has been uniformly coated with radiation-to-heat conversion layer 72. Radiation-to-heat conversion layer 72 includes material capable of absorbing radiation at the wavelength of interest and emitting heat. Flexible support 70 has been further uniformly coated with coated material 74. Coated material 74 comprises coated side 80 of donor element 31.

Figure 7C:
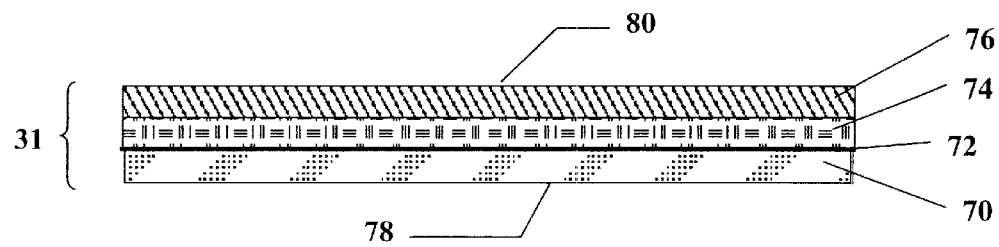
FIG. 7C is a cross-sectional representation of the structure of the donor element coated with more than one layer of coated material.

FIG. 7C is one example of a cross-sectional representation of the structure of a donor element coated with more than one layer of coated material. Donor element 31 includes flexible support 70, which comprises non-transfer surface 78. Flexible support 70 has been uniformly coated with radiation-to-heat conversion layer 72. Radiation-to-heat conversion layer 72 includes material capable of absorbing radiation at the wavelength of interest and emitting heat. Flexible support 70 has been further uniformly coated with coated material 74 and coated material 76. Coated material 76 comprises coated side 80 of donor element 31.

FIG. 8 is a cross-sectional representation of another embodiment of the present invention in which the donor support element is coated and the transfer to the substrate is affected in different separate evacuated chambers. Vacuum coater 10 in this embodiment includes coating chamber 10a, transfer chamber 10b, and transport chamber 90, all of which are held under vacuum. Coating chamber 10a includes load lock 14, which is used to load and unload the chamber. Transfer chamber 10b similarly includes load lock 16, which is used to load and unload the chamber. Coating chamber 10a includes coating station 20 and transfer chamber 10b includes transfer station 22. Transport chamber 90 is moveable and includes load lock 92, which is designed to form an airtight seal with load locks 14 and 16. Transport chamber 90 can also include a means (not shown) of maintaining a vacuum during transport.

Donor support element 30 is introduced to coating chamber 10a by means of load lock 14. Donor support element 30 can optionally be supported by donor support 32. Donor support element 30 is transferred by mechanical means to coating station 20, which includes coating apparatus 34. Coating apparatus 34 is activated (e.g. desired coating material is heated to vaporize it) and donor 30 is coated evenly with coating material, rendering it into donor element 31.

Transport chamber 90 is moved into a position such that load lock 92 can make an airtight connection to load lock 14. Donor element 31 is transferred by mechanical means from coating station 20 to transport chamber 90. Transport chamber 90 is then disconnected from coating chamber 10a while maintaining a vacuum internally.

Receiver element 42 is introduced to transfer chamber 10b by means of load lock 16 and transferred by mechanical means to transfer apparatus 36. Transfer apparatus 36 is shown for convenience in the closed configuration, but it also has an open configuration in which the donor element and substrate loading and unloading occur. Transport chamber 90 is moved into a position such that load lock 92 can make an airtight connection to load lock 16. Donor element 31 is transferred by mechanical means from transport chamber 90 to transfer station 22. Donor element 31 and receiver element 42 are placed in a material transferring relationship, that is, the coated side of donor element 31 is placed in close contact with the receiving surface of receiver element 42 and held in place by a means such as fluid pressure in pressure chamber 44, as described by Phillips, et al. Donor element 31 is then irradiated through transparent portion 46 by applied radiation, such as by laser beam 40 from laser 38. The irradiation of donor element 31 in a pattern causes the transfer of coated material from donor element 31 to receiver element 42, as described by Phillips, et al.

After irradiation is complete, transfer apparatus 36 is opened and donor element 31 and receiver element 42 can be removed via load lock 16. Alternatively, donor element 31 can be removed via load lock 16 while receiver element 42 is left in place. The transfer process can then be repeated using receiver element 42 and a new donor element 31.

The invention and its advantages can be better appreciated by the following comparative examples.

EXAMPLE 1

An OLED device satisfying the requirements of the invention was constructed in the following manner:

1. A stainless-steel donor support element, 8 inches wide and 0.001 inches thick, was placed under vacuum in a vacuum coater of the type described herein.
2. A 375 Å thick layer of tris(8-quinolinolato)aluminum(III) ($Alq_3$) was deposited onto the donor support element at a coating station that included a heated tantalum boat source. The deposition rate was 4 Å/second.
3. A glass receiver element, coated with an anode layer of indium-tin-oxide and cleaned, was placed into the vacuum coater via a load lock so as to not disturb the vacuum environment of the donor element.
4. A 1500 Å hole-transport layer of 4,4'-bis-[N-(1-naphthyl)-N-phenylamino]biphenyl (NPB) was deposited onto the receiver element at a second coating station in the vacuum coater by evaporation from a tantalum boat source.
5. The donor element was positioned 1 cm below the NPB-coated glass receiver element at a transfer station in the vacuum coater. Quartz lamps were used to radiatively heat the non-transfer surface of the donor element to a temperature sufficient to completely transfer the coated layer from the donor element to the receiver element in approximately 2 seconds.
6. A 375 Å electron-transport layer of $Alq_3$ was deposited onto the receiver element at a coating station that included a heated tantalum boat source.
7. A 2200 Å cathode layer was deposited onto the receiver element at a coating station with separate tantalum boats, one of which contained silver and one of which contained magnesium. The cathode layer was a 10:1 atomic ratio of magnesium and silver.

EXAMPLE 2

A comparative OLED device was constructed in the manner described in Example 1, except that the donor element prepared in steps 1 and 2 was then exposed to the air for 5 minutes, simulating a transfer of a donor element from a vacuum coater to a separate vacuum transfer chamber. Following this exposure, the donor element was again placed under vacuum and used in the subsequent steps of Example 1.

EXAMPLE 3

A comparative OLED device was constructed in the manner described in Example 1, except that the donor element prepared in steps 1 and 2 was then exposed to the air for 20 minutes, simulating a transfer of a donor element from a vacuum coater to a separate vacuum transfer chamber. Following this exposure, the donor element was again placed under vacuum and used in the subsequent steps of Example 1.

Results

The devices prepared in the above examples were operated at a current of 20 $mA/m^2$. The luminance in candelas per square meter was measured initially, and after various periods of usage. The following table shows the results.

| Example # | Donor Element Exposure Time to air (minutes) | Initial Luminance at 20 $mA/cm^2$ ($cd/m^2$) | Voltage at 20 $A/cm^2$ (V) | Operational Stability at 20 $mA/cm^2$ (% initial luminance) | | | |
|---|---|---|---|---|---|---|---|
| | | | | 10 hrs | 100 hrs | 250 hrs | 500 hrs |
| 1 | 0 | 620 | 7.9 | 86% | 75% | 67% | 60% |
| 2 | 5 | 360 | 7.3 | 61% | 45% | 37% | 30% |
| 3 | 20 | 275 | 7.5 | 63% | 46% | 38% | 29% |

The initial luminance of Example 1—which had no exposure to air during fabrication—was 620 $cd/m^2$. Examples 2 and 3—whose donor elements were transferred in the air for 5 and 20 minutes, respectively—had initial luminances of 360 $cd/m^2$ and 275 $cd/m^2$, or 58% and 44% of Example 1, respectively. Thus, exposure of the donor element to air for a short time had a negative effect on the initial luminance of the OLED device. Furthermore, the luminance of Examples 2 and 3 degraded more quickly with time. For instance, after 250 hours of operation, the luminance of Example 1 was 67% of its initial luminance of 620 cd/m$^2$, or 415 cd/m$^2$. After the same period of operation, the luminance of Example 2 was 37% of its initial luminance of 360 cd/m$^2$, or 135 cd/m$^2$.

The invention has been described in detail with particular reference to certain preferred embodiments thereof, but it will be understood that variations and modifications can be affected within the spirit and scope of the invention.

PARTS LIST

| | |
|---|---|
| 10 | vacuum coater |
| 10a | coating chamber |
| 10b | transfer chamber |
| 12 | vacuum pump |
| 14 | load lock |
| 16 | load lock |
| 18 | load lock |
| 20 | coating station |
| 22 | transfer station |
| 24 | coating station |
| 26 | cleaning station |
| 30 | donor support element |
| 31 | donor element |
| 32 | donor support |
| 34 | coating apparatus |
| 34a | coating apparatus |
| 36 | transfer apparatus |
| 38 | laser |
| 40 | laser beam |
| 42 | receiver element |
| 44 | pressure chamber |
| 46 | transparent portion |
| 50 | heater |
| 51 | flash lamp |
| 52 | vapor remover |
| 60 | moveable web |
| 62 | wheel |
| 64 | direction of travel |
| 70 | flexible support |
| 72 | radiation-to-heat conversion layer |
| 74 | coated material |
| 76 | coated material |
| 78 | non-transfer surface |
| 80 | coated side |
| 90 | transport chamber |
| 92 | load lock |

What is claimed is:

1. An in-situ vacuum method for fabricating, at least in part, an OLED device that is moisture- or oxygen-sensitive, such method comprising the steps of:
   a) providing into a vacuum coater a receiver element which will form part of the OLED device;
   b) providing into said vacuum coater a donor support element and coating such donor support element to produce a donor element with one or more layers required to produce all or part of the OLED device;
   c) positioning the coated side of the donor element in material transferring relationship to the receiver element to be coated within said vacuum coater; and
   d) applying radiation to the donor element to selectively transfer in vacuum one or more layers from the donor element to the receiver element.

2. The method of claim 1 further including the step of:
   e) coating by the vacuum coater the receiver element with one or more layers which forms part of the OLED device.

3. The method of claim 1 further including the step of:
   e) repeating steps b) to d) to produce all or part of the moisture- or oxygen-sensitive device.

4. The method of claim 3 further including coating said receiver element with a desired number of coated layers.

5. The method of claim 1 further including the step of:
   e) cleaning the donor element to permit it to be recoated.

6. The method of claim 1 further including the step of providing the donor element as part of a moveable web which moves into the material transferring relationship with the receiver element.

7. The method of claim 6 further including the step of cleaning the donor element to permit it to be recoated.

8. An in-situ vacuum method useful in fabricating a full-color display formed of a number of OLED devices, such display being moisture- or oxygen-sensitive, such method comprising the steps of:
   a) providing into a vacuum coater a receiver element which will form part of the display;
   b) providing into said vacuum coater a plurality of donor support elements and coating such donor support elements with materials and wherein each of the donor support elements has at least one different material for providing a different output color from a corresponding OLED device;
   c) sequentially positioning the coated side of each of the donor elements in material transferring relationship to the receiver element to be coated; and
   d) sequentially applying radiation to the positioned donor elements to selectively transfer in vacuum one or more layers from each of the donor elements to corresponding OLED devices formed in the receiver element.

9. The method of claim 8 further including the step of:
   e) coating by the vacuum coater the receiver element with one or more layers which forms part of OLED devices.

10. The method of claim 8 further including the step of:
    e) providing into said vacuum coater one or more donor support elements and coating such donor support element(s) to produce donor element(s) with one or more layers required to produce all or part of the OLED device;
    f) positioning the coated side of the donor element in material transferring relationship to the receiver element to be coated within said vacuum coater;
    g) applying radiation to the donor element to selectively transfer in vacuum one or more layers from the donor element to the receiver element; and
    h) repeating steps f) to g) to produce all or part of the moisture- or oxygen-sensitive device.

11. The method of claim 10 further including coating said receiver element with a desired number of coated layers.

12. The method of claim 8 further including the step of:
    e) cleaning the donor elements to permit them to be recoated.

13. The method of claim 8 further including the step of providing each of the donor elements as part of a moveable web which moves into the material transferring relationship with the receiver element.

14. The method of claim 13 further including the step of cleaning the donor elements to permit them to be recoated.

* * * * *

UNITED STATES PATENT AND TRADEMARK OFFICE
CERTIFICATE OF CORRECTION

PATENT NO. : 6,555,284 B1
DATED : April 29, 2003
INVENTOR(S) : Michael L. Boroson et al.

It is certified that error appears in the above-identified patent and that said Letters Patent is hereby corrected as shown below:

<u>Title page,</u>
Item [57], ABSTRACT,
Lines 9 and 10, "relinquish to the receiver element to be coated; and applying radiation to the d nor" should read -- relationship to the receiver element to be coated; and applying radiation to the donor --

Signed and Sealed this

Twenty-second Day of June, 2004

JON W. DUDAS
*Acting Director of the United States Patent and Trademark Office*